United States Patent
Otsuka et al.

(10) Patent No.: US 6,861,679 B2
(45) Date of Patent: Mar. 1, 2005

(54) GALLIUM INDIUM NITRIDE ARSENIDE BASED EPITAXIAL WAFER, A HETERO FIELD EFFECT TRANSISTOR USING THE WAFER, AND A METHOD OF FABRICATING THE HETERO FIELD EFFECT TRANSISTOR

(75) Inventors: Nobuyuki Otsuka, Kawanishi (JP); Koichi Mizuno, Nara (JP); Shigeo Yoshii, Hirakata (JP); Asamira Suzuki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/817,035

(22) Filed: Apr. 5, 2004

(65) Prior Publication Data

US 2004/0188708 A1 Sep. 30, 2004

Related U.S. Application Data

(63) Continuation of application No. PCT/JP03/13747, filed on Oct. 28, 2003.

(30) Foreign Application Priority Data

Oct. 29, 2002 (JP) .................................. 2002-313902
Oct. 31, 2002 (JP) .................................. 2002-318190

(51) Int. Cl.⁷ .......................................... H01L 31/0328
(52) U.S. Cl. ...................... 257/194; 257/201; 438/167; 438/172
(58) Field of Search ................................ 257/194, 192, 257/201; 438/167, 172

(56) References Cited

U.S. PATENT DOCUMENTS 6,100,546 A * 8/2000 Major et al. ................. 257/103
6,787,822 B1 * 9/2004 Nuyen ........................ 257/198

FOREIGN PATENT DOCUMENTS

| JP | 2000-91559 A | 3/2000 |
| JP | 2000-164852 A | 6/2000 |
| JP | 2000-216101 A | 8/2000 |
| JP | 2002-94187 A | 3/2002 |
| JP | 2003-289082 A | 10/2002 |
| JP | 2003-197644 A | 7/2003 |

OTHER PUBLICATIONS

Hang, D.R. et al., "Shubnikov–de Haas oscillations of two–dimensional electron gas in and in AsN/InGaAs single quantum well", *Semiconductor Science and Technology*, vol. 17, No. 9, Sep. 2002, pp. 999–1003.

Wang, Jyh–Shyang et al. , "Growth of InAsn/InGaAs (P) quantum wells on InP by gas source molecular beam epitaxy". *Journal of Vacuum Science& Technology B*, vol. 19, No. 1 Jan./Feb. 2001, pp. 202–206.

* cited by examiner

Primary Examiner—Sara Crane
(74) Attorney, Agent, or Firm—McDermott Will & Emery LLP

(57) ABSTRACT

A hetero field effect transistor according to the present invention comprises an InP substrate, a channel layer provided on the InP substrate with a buffer layer disposed between the InP substrate and the channel layer, a spacer layer constituted by a semiconductor having a band gap larger than that of the channel layer formed to hetero-join to the channel layer, and a carrier supply layer formed to be adjacent to the spacer layer, wherein the channel layer comprises a predetermined semiconductor layer constituted by a compound semiconductor represented by a formula $Ga_xIn_{1-x}N_yA_{1-y}$ in which A is As or Sb, composition x satisfies $0 \leq x \leq 0.2$, and composition y satisfies $0.03 \leq y \leq 0.10$.

19 Claims, 14 Drawing Sheets

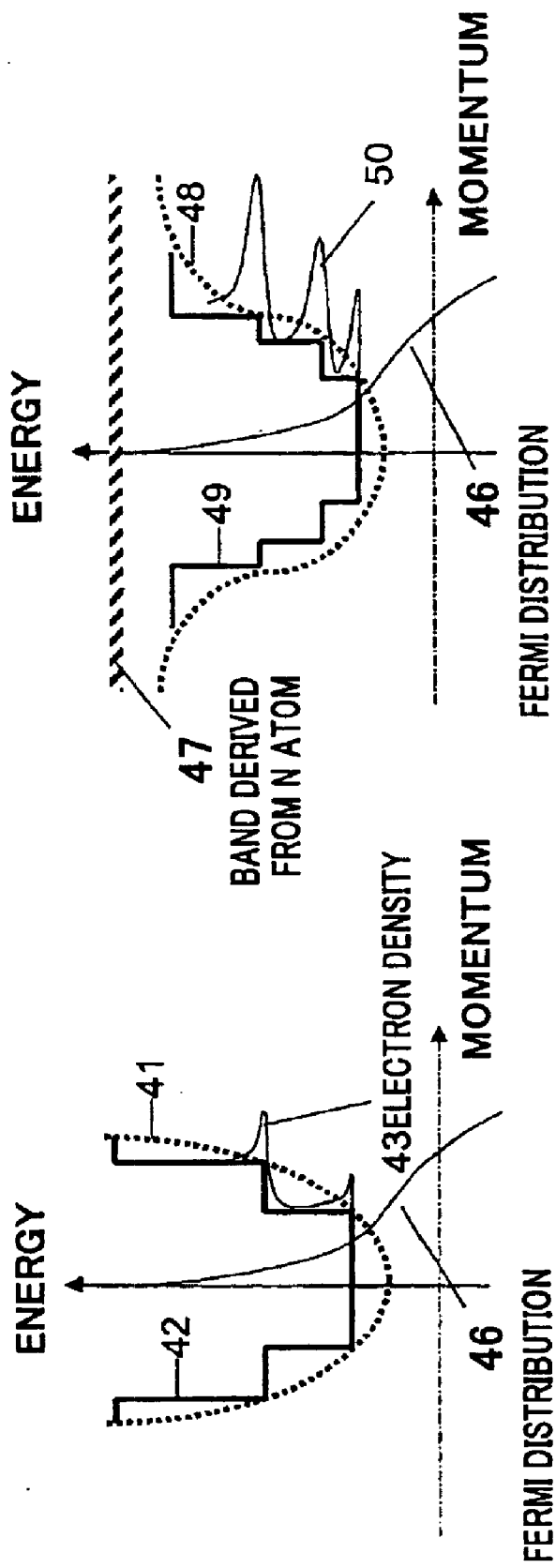

|                  | GaAs | InP  | InGaAs | GaInNAs | InAs | InNAs |
|------------------|------|------|--------|---------|------|-------|
| $\mu 1$ (m²/Vs)  | 0.8  | 0.5  | 2      | 0.2     | 3    | 1.5   |
| $\Delta_{\Gamma L}$ (eV) | 0.31 | 0.59 | 0.55 | 0.63 | 0.72 | 0.82 |
| $v_d$ (×10⁵m/s)  | 1.62 | 2.08 | 3.96   | 1.38    | 5.72 | 4.47  |

Fig. 4

GALLIUM INDIUM NITRIDE ARSENIDE BASED EPITAXIAL WAFER, A HETERO FIELD EFFECT TRANSISTOR USING THE WAFER, AND A METHOD OF FABRICATING THE HETERO FIELD EFFECT TRANSISTOR

This is a continuation application under 35 U.S.C 111(a) of pending prior International application No. PCT/JP03/13747, filed on Oct. 28, 2003.

BACKGROUND OF THE INVENTION

1. Technical Field

The present invention relates to a hetero field effect transistor using a gallium indium nitride arsenide based epitaxial wafer, to a method of fabricating the hetero field effect transistor, and to a transmitter-receiver using the hetero field effect transistor.

2. Related Art

A hetero field effect transistor such as a high electron mobility transistor (HEMT) is a compound semiconductor device using a two-dimensional electron gas formed by a hetero structure.

FIG. 13 shows a conventional HEMT as a first prior art example of such HEMT, comprising an InAlAs carrier supply layer/an InGaAs channel layer/an InAlAs buffer layer formed on an InP substrate. In FIG. 13, reference numerals 1 to 7 denote an electrode metal, an n$^+$-InGaAs cap layer, an n-InAlAs carrier supply layer, an i-InAlAs spacer layer, an i-InGaAs channel layer, an i-InAlAs buffer layer, and a semi-insulating InP substrate (S.I.-InP substrate), respectively. The HEMT comprising InGaAs as the channel layer 5 exhibits a good high-frequency characteristic because of a high electron transport characteristic thereof, in contrast to an HEMT comprising GaAs as a channel layer. Especially, the first prior art example is characterized by inserting an InAs layer 8 with a thickness of 1 to 7 nm into the InGaAs channel layer 5 at a position 0 to 6 nm away from the InAlAs spacer layer 4 (see Japanese Laid-Open Patent Application Publication No. Hei. 5-36726).

FIG. 14 shows a conventional HEMT as a second prior art example, comprising a GaInNAs channel layer formed on a GaAs substrate. Specifically, the HEMT is structured such that an undoped GaAs buffer layer 12 with a thickness of 0.5 $\mu$m is provided on a semi-insulating GaAs substrate 11, and an undoped GaInNAs channel layer 13 with a thickness of 15 nm is provided on the buffer layer 12. Further, in this HEMT, an n-type AlGaAs carrier supply layer 14 with a thickness of 50 nm is provided on the GaInNAs channel layer 13, with an undoped AlGaAs spacer layer 16 with a thickness of 2 nm disposed between the channel layer 13 and the carrier supply layer 14, and an electrode 18 is formed by evaporation on the AlGaAs carrier supply layer 14. Al compositions of the spacer layer 16 and of the carrier supply layer 14 are both 0.28 (see Japanese Laid-Open Patent Application Publication No. 2000-164852).

In the first prior art example, however, when the InAs layer 8 is inserted as described above, a lattice mismatching arises, thereby causing defects to occur if the InAs layer 8 has a film thickness not less than a critical film thickness. Therefore, the thickness of the channel layer 8 needs to be less than the critical thickness, so that sufficient carrier density can not be realized and therefore the characteristic is not improved sufficiently.

On the other hand, in the second prior art example, N is introduced into InGaAs composing the channel layer 13, in order to solve problems associated with characteristic which are caused by difficulty of lattice matching of the InGaAs layer with respect to the GaAs substrate, when the InGaAs layer is formed on the GaAs substrate 11. In the second prior art example, the channel layer 13 comprising GaInNAs lattice matches to the GaAs substrate 11. Therefore, the characteristic is indeed improved in contrast with a case where the InGaAs channel layer is formed on the GaAs substrate 11. However, a characteristic better than that of the first prior art example in which the InGaAs channel layer is formed on the InP substrate is not realized.

SUMMARY OF THE INVENTION

An object of the present invention is to provide a hetero field effect transistor capable of operating at a high speed by improving an electron mobility, a method of fabricating the transistor, and a transmitter-receiver.

To achieve the above-described object, a hetero field effect transistor according to the present invention comprises a substrate, a channel layer provided on the substrate with a buffer layer disposed between the substrate and the channel layer, a spacer layer constituted by a semiconductor having a band gap larger than a band gap of the channel layer formed to hetero-join to the channel layer, and a carrier supply layer formed to be adjacent to the spacer layer, wherein the substrate is made of InP, the channel layer comprises a compound semiconductor layer represented by a formula $Ga_xIn_{1-x}N_yA_{1-y}$ in which A is As or Sb, composition x satisfies $0 \leq x \leq 0.2$, and composition y satisfies $0.03 \leq y \leq 0.10$.

The composition y may satisfy $0.03 \leq y \leq 0.07$.

A may be As.

A may be Sb.

The channel layer may be constituted by only the compound semiconductor layer.

The channel layer may comprise a first channel layer and a second channel layer which is formed to be adjacent to the first channel layer and hetero-joins to the spacer layer, the first channel layer may be constituted by the compound semiconductor layer, and the second channel layer may be constituted by an InAs layer.

x may be 0.

An N concentration in the first channel layer may decrease as the N concentration is closer to the second channel layer.

A pair of second channel layers are formed to be adjacent to upper and lower surfaces of the first channel layer, a pair of spacer layers are formed to hetero-join to the pair of second channel layers, respectively, and a pair of carrier supply layers are formed to be adjacent to the pair of spacer layers, respectively.

0<x may be satisfied.

$3y \leq x \leq 0.2$ may be satisfied.

$0.1 \leq x \leq 0.2$ may be satisfied.

The first channel layer may be constituted by a GaInNAs/InAs MQW layer having a multiple quantum well structure formed by alternately stacking a GaInNAs layer constituted by the compound semiconductor layer in which 0<x is satisfied and an InAs layer.

The first channel layer may be constituted by an InNAs/InAs MQW layer having a multiple quantum well structure formed by alternately stacking an InNAs layer constituted by the compound semiconductor layer in which x is 0 and an InAs layer.

The buffer layer and the spacer layer may be constituted by an InAlAs layer, and the carrier supply layer may be constituted by an n-InAlAs layer.

A method of fabricating a hetero field effect transistor according to the present invention comprises the steps of forming a channel layer on a substrate with a buffer layer disposed between the substrate and the channel layer, forming a spacer layer constituted by a semiconductor having a band gap larger than a band gap of the channel layer to hetero-join to the channel layer, and forming a carrier supply layer to be adjacent to the spacer layer, wherein the substrate is made of InP, the channel layer comprises a compound semiconductor layer represented by a formula $Ga_xIn_{1-x}N_yA_{1-y}$ in which A is As or Sb, composition x satisfies $0 \leq x \leq 0.2$, and composition y satisfies $0.03 \leq y \leq 0.10$.

Ionized N atom may be introduced in the step of forming the channel layer.

The method of fabricating a hetero field effect transistor comprises the step of forming the buffer layer made of InAlAs on the InP substrate, wherein the step of forming the channel layer comprises the steps of forming a first channel layer made of InNAs on the buffer layer and forming a second channel layer made of InAs on the first channel layer, and the spacer layer made of InAlAs may be formed on the second channel layer in the step of forming the spacer layer. Thus structured, a preferable interface between the channel layer and the spacer layer is formed because N atom and Al atom do not coexist when forming the interface.

The transmitter-receiver according to the present invention comprises the hetero field effect transistor according to claim 1 for processing a transmission signal or a received signal.

This object, as well as other objects, features and advantages of the invention will become more apparent to those skilled in the art from the following description taken with reference to the accompanying drawings.

BRIEF DESCRIPTION OF THE DRAWINGS

FIGS. 3A and 3B are views showing an energy state in the band structure in FIGS. 2A and 2B, in which FIG. 3A is an enlarged view of the energy state at a point Γ in FIG. 2A, and FIG. 3B is an enlarged view of the energy state at point Γ in FIG. 2B;

FIG. 4 is a table showing physical values in crystalline of various compound semiconductors;

FIGS. 10A and 10B are views each showing a structure of a hetero field effect transistor according to a third embodiment of the present invention, in which FIG. 10A is a cross-sectional view and FIG. 10B is a view showing an energy state in the vicinity of a channel layer in FIG. 10A;

DETAILED DESCRIPTION OF THE PREFERRED EMBODIMENTS

Hereinafter, embodiments of the present invention will be described with reference to drawings.

{Concept of the Present Invention}

First of all, a concept of the present invention will be described.

A hetero field effect transistor of the present invention is characterized by a structure in which GaInNAs comprising a predetermined range of composition ratio of Ga and N is formed as a channel layer on an InP substrate. In the present invention, GaInNAs is comprised of InNAs in an embodiment in which no Ga is contained. In other words, in the hetero field effect transistor of the present invention, the first prior art example is altered to have a constitution in which a composition ratio of Ga in an InGaAs channel layer is set to a predetermined value and N is added to the InGaAs channel layer to obtain a predetermined composition ratio.

First, an effect of adding N atom to an InGaAs crystal will be briefly described with reference to FIGS. 2A, 2B, 3A, and 3B.

Figures 2A, 2B:
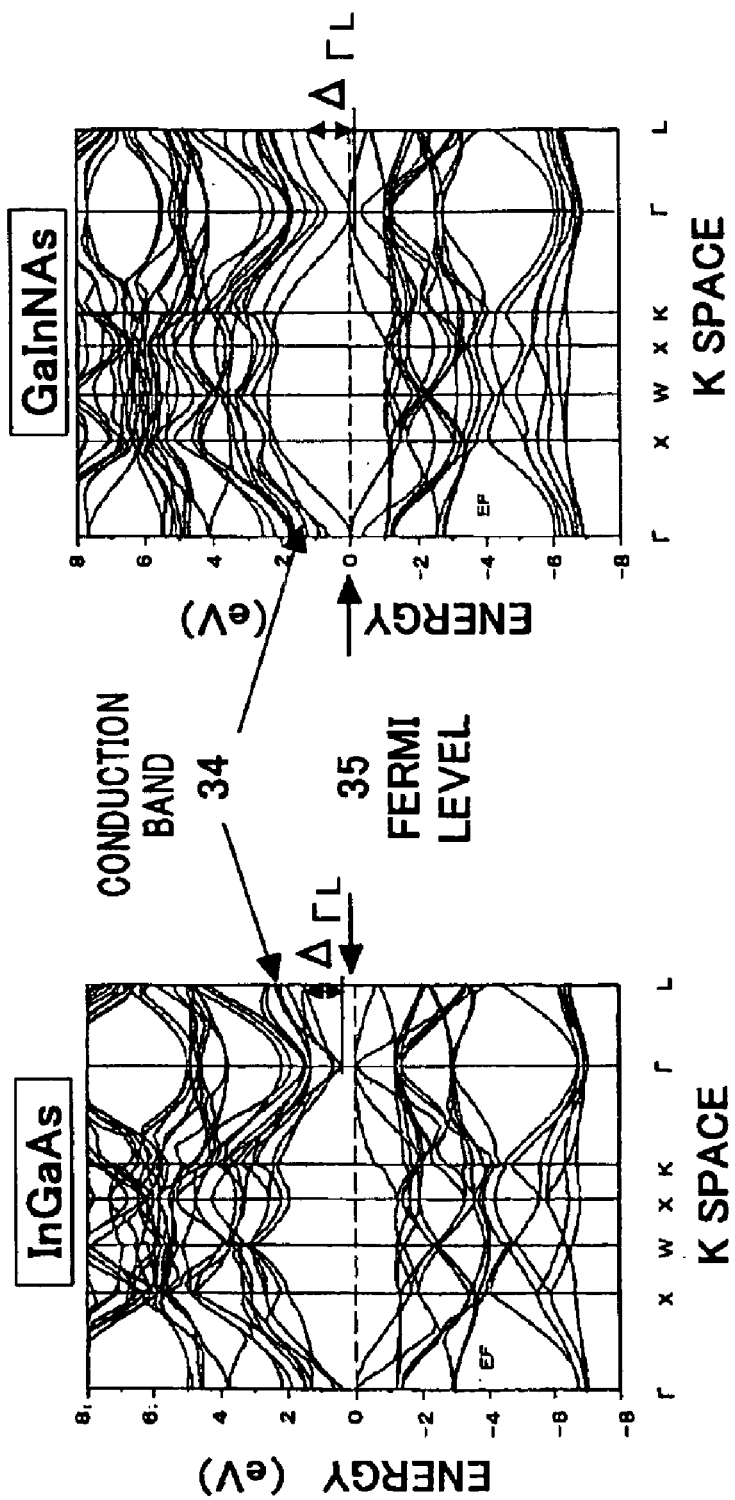
FIG. 2A is a view showing a band structure of InGaAs and FIG. 2B is a view showing a band structure of GaInNAs.

FIGS. 2A and 2B show band structures of InGaAs and of GaInNAs, respectively. FIG. 3A is an enlarged view showing an energy state at a point Γ in FIG. 2A, and FIG. 3B is an enlarged view showing an energy state at a point Γ in FIG. 2B. In FIGS. 2A and 2B, an abscissa axis represents a position in K space, and an ordinate axis represents energy. In FIGS. 3A and 3B, an abscissa axis represents momentum, and an ordinate axis represents energy.

FIGS. 2A and 2B are obtained from simulations, on assumption that an $In_{0.5}Ga_{0.5}As$ crystal layer is formed on the InP substrate in the prior art example, and a $Ga_{0.5}In_{0.5}N_{0.125}As_{0.875}$ crystal layer is formed on the InP substrate in the present invention.

As shown in FIG. 2A, an energy level is the lowest at the point Γ and electrons travel through the point Γ in a band structure of a conduction band 34 of the $In_{0.5}Ga_{0.5}As$ crystal. As shown in FIG. 3A, in the case of InGaAs of bulk, the energy is directly proportional to a square of momentum as represented by a dotted line 41. In a quantum well structure having an InGaAs layer as a well layer, the energy of electrons is quantized to form a step-like band structure as represented by a bold solid line 42, and the electrons have a density distribution as represented by a thin solid line 43 by overlap integral with a Fermi distribution 46 of electrons.

On the other hand, as shown in FIG. 2B, in a $Ga_{0.5}In_{0.5}N_{0.125}As_{0.875}$ crystal, the energy state in the vicinity of a point W is flat by an effect of adding N. Due to an existence of a level of N, the energy at the point Γ decreases while the energy at a point L scarcely decreases. That is to say, an energy difference $\Delta_{\Gamma L}$ between the point Γ and the point L is increased by adding N. As described later, the bigger the difference $\Delta_{\Gamma L}$ is, the greater a maximum value of a drift velocity of electrons is. Thus, adding N has an advantage. However, as shown in FIG. 3B which is an enlarged view of the vicinity of the point Γ, an energy distribution 48 of GaInNAs of bulk deviates from a value which is directly proportional to the square of momentum and an increase in the energy falls. This is because a band 47 derived from N atom is formed by adding N atom and causes mixing with a band 41 proper to InGaAs (see FIG. 3A). When the band mixing arises, the band 47 derived from N atom and the band 41 proper to InGaAs repel each other as shown in FIG. 3B, so that the closer to the band 47 derived from N atom the band 41 proper to InGaAs is, the smaller the energy at the same momentum is. Even when the momentum equals 0, the mixing between the band 47 derived from N atom and the band 41 proper to InGaAs exists, so that a curvature of the energy distribution 48 of GaInNAs is increased even when the momentum is 0.

The effect of adding N atom will be described from another viewpoint, i. e., a viewpoint of an effective mass of electrons. An increase in the curvature of the band means an increase in the effective mass of electrons, and a momentum dependency of the energy of the band 47 derived from N atom is linear, so that the curvature and the effective mass of the band 47 are large. On the other hand, as the band proper to InGaAs has a small curvature, the effective mass thereof is correspondingly small. Therefore, when N atom is added to InGaAs, the mixing arises between InGaAs and the band of N atom of a large effective mass, so that the effective mass of GaInNAs becomes larger than that of InGaAs. This means that the curvature of the energy distribution 48 of GaInNAs becomes larger.

Subsequently, how the increase in the band curvature caused by adding N atom affects on an electronic device will be described. When the electronic device comprising a hetero structure is used, the electrons are generally localized on a hetero interface between a spacer layer and a channel layer, and the energy state is quantized to have a step-like energy distribution. As a result, the energy varies greatly at step-like portions, so that a state in which the electrons can exist (a state density) is increased there. The larger the energy difference between the spacer layer and the channel layer is and the smaller the effective mass is, the fewer the number of steps is. Meanwhile, the Fermi distribution 46 shows up to how high energy the electrons can exist at room temperature. An electron density at a specified energy is obtained by multiplying the state density in which the electrons can exist by the Fermi distribution of electron. Three possible methods of increasing the electron density are: (1) decreasing the band gap of the channel layer to approximate it to a Fermi level to increase a product of the state density and the Fermi distribution, (2) decreasing the energy difference at the step-like portions to approximate a quantum level of a high order to the Fermi level to thereby increase the product of the state density and the Fermi distribution, and (3) increasing the effective mass to increase the state density itself. Adding N atom to the channel layer has the following results: (1) the band gap is decreased (as the amount of In to be added for lattice matching is increased by adding N atom), (2) the number of steps is decreased as the effective mass is increased, and (3) the state density is increased as the effective mass is increased. Therefore, there is an advantage in which, since the state density is increased by adding N atom, the electrons are hardly overflow from the point Γ into the point L, even when a strong electric field is applied. This is very effective when a channel length is shortened, because an operation speed is hardly saturated and Gunn oscillation does not occur.

As described above, while the effective mass is increased and the mobility is decreased by adding N atom, there is an advantage in which $\Delta_{\Gamma L}$ is increased and the state density is also increased. Accordingly, these effects are quantitatively evaluated to what extent they can be expected. The result is shown on a table in FIG. 4. On the table, physical values obtained from the quantitative evaluation are shown. An embodiment and an evaluation of the hetero field effect transistor of the present invention become possible by revealing the physical values.

Figure 5:
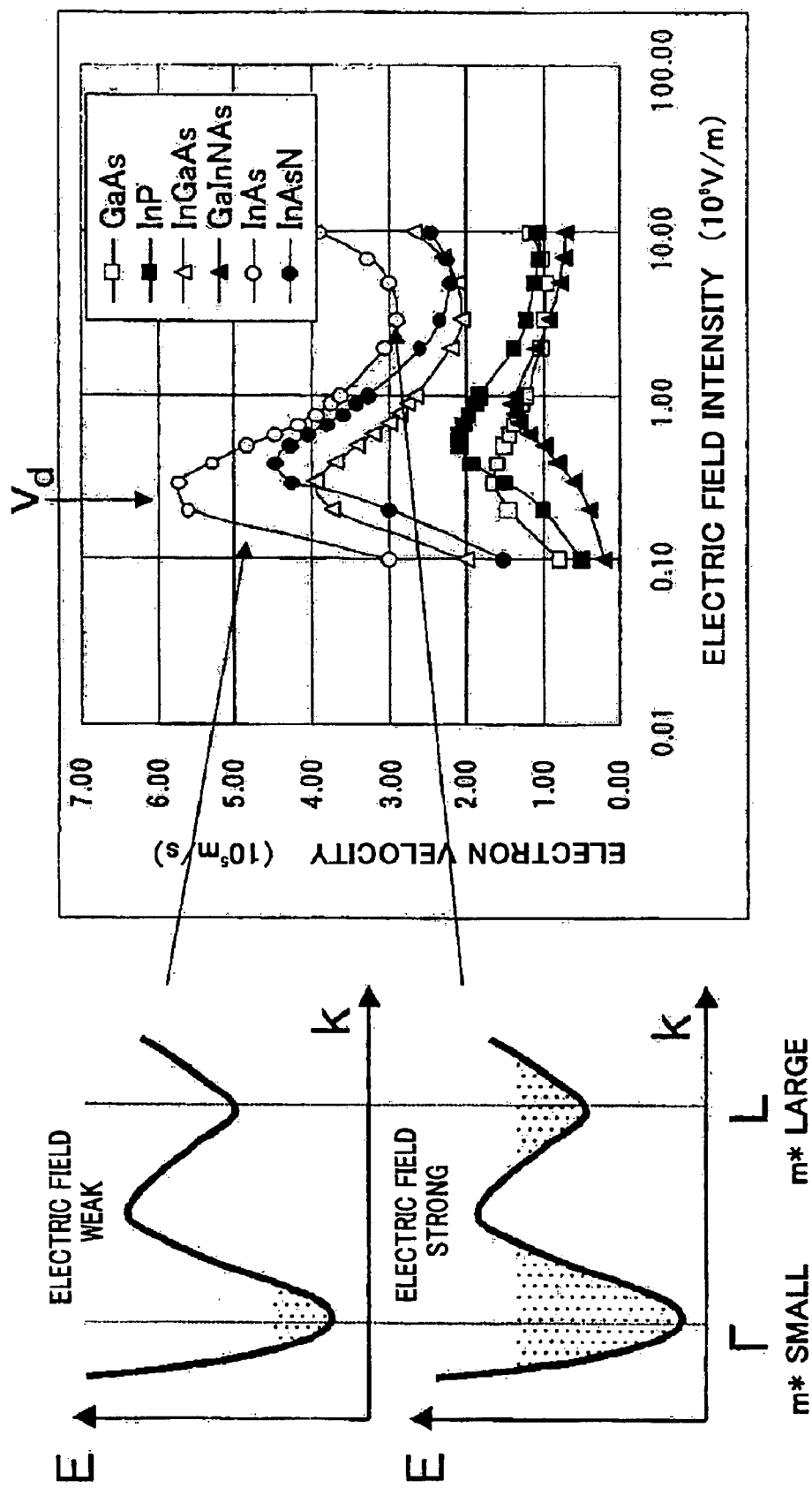
FIG. 5 is a view showing a relationship between an electron velocity and an electric field.

FIG. 5 shows an electron velocity calculated from an electron mobility (Hall mobility) $\mu 1$ in a weak electric field and $\Delta_{\Gamma L}$. FIG. 5 shows that the electron velocity is increased as the electric field is applied but when the electric field not less than that corresponding to a point $V_d$ where the electron velocity is the maximum is applied, the electron velocity is decreased adversely. The reason for this is that when the electric field is weak, the electrons exist at the point Γ where the effective mass is small and the mobility is high, so that the electron velocity is increased as the electric field is applied, but when the electric field not less than that corresponding to $V_d$ is applied, the electrons overflow into the point L, as shown on the left end of FIG. 5. Since the effective mass m* is large and the mobility is low at the point L, the total mobility is decreased and the electron velocity is also decreased. The maximum value of the electron velocity is represented by $V_d$ in FIG. 4. As obviously shown in FIG. 4, the maximum values of the electron velocity $V_d$ are increased in the following order: GaInNAs<GaAs<InP<InGaAs <InNAs <InAs. This is because $\Delta_{\Gamma L}$ of InP is larger than that of GaAs, and further $\mu 1$ of InGaAs and InAs are larger than that of GaAs. In the case of GaInNAs, since $\Delta_{\Gamma L}$ is large but $\mu 1$ is extremely small, the maximum value $V_d$ of the electron velocity is decreased to not more than that of GaAs. On the other hand, in the case of InNAs, $\mu 1$ is decreased in contrast to that of InGaAs, but as $\Delta_{\Gamma L}$ is large, the $V_d$ (=4.47×10$^5$ m/s) larger than that of InGaAs ($V_d$ =3.96×10$^5$ m/s) is obtained. As a result, it has been proved that by changing the channel layer from the InGaAs layer to the InNAs layer, the electron velocity is increased and the operation speed is improved approximately 20%.

In other words, when the channel layer is changed from the InGaAs layer to the InNAs layer, the electron velocity is increased and the operation speed is improved approximately 20%, although the electron velocity and the operation speed are decreased when the channel layer is changed from the InGaAs layer to the GaInNAs layer. Therefore, it has been proved that by using the GaInNAs layer comprising a predetermined range of the composition ratio of Ga as the channel layer in place of the InGaAs layer, the electron velocity is increased and the operation speed is improved.

Next, a preferred range of the composition ratio of Ga and N in the GaInNAs layer will be described.

Figure 6:
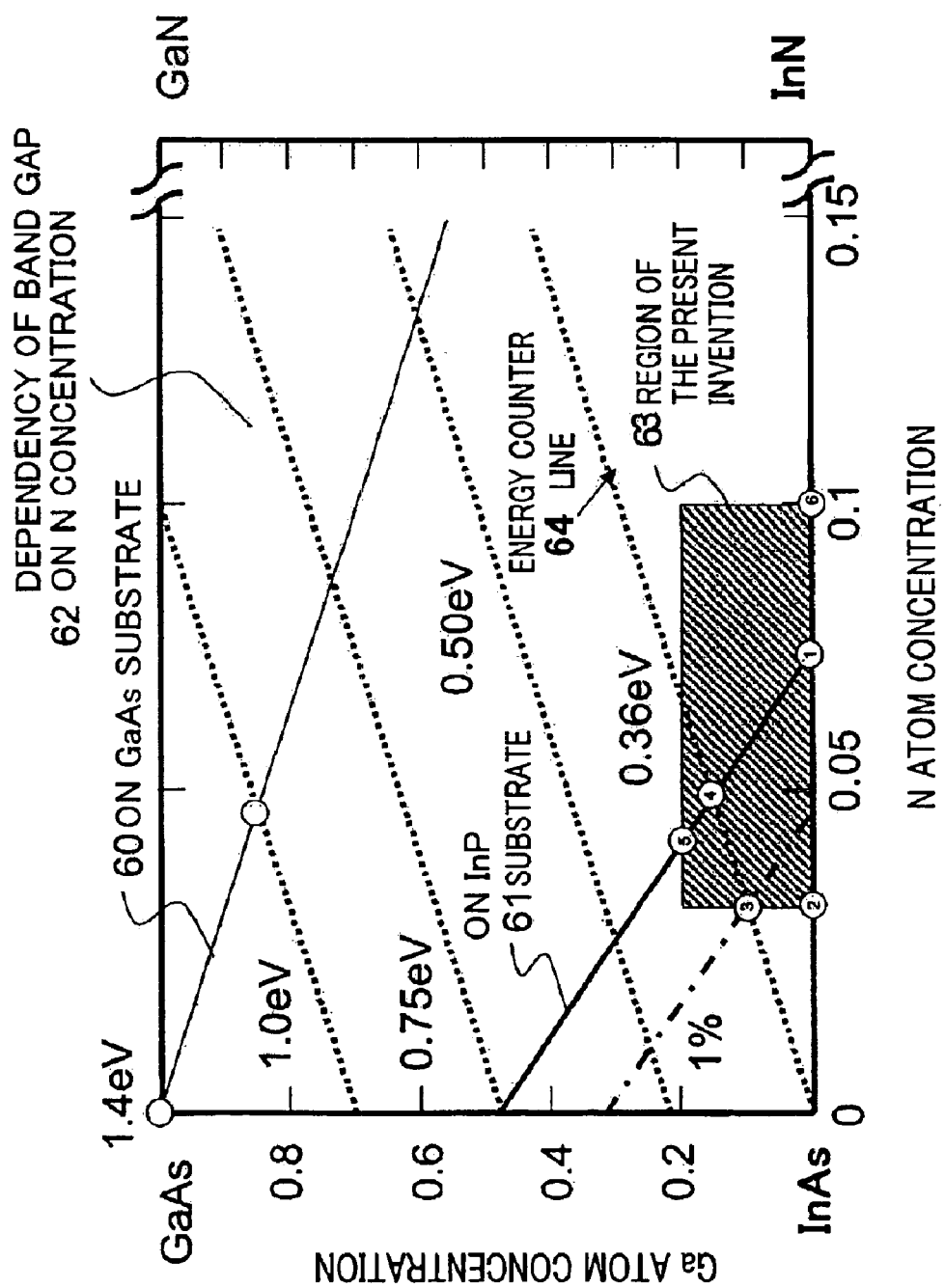
FIG. 6 is a view showing a preferable range of a composition ratio of Ga and N in a GaInNAs four-element based compound forming a channel layer of the present invention.

FIG. 6 is a view showing the preferred range of the composition ratio (hereinafter, also referred to as a concentration, an atomic concentration, to be precise) of Ga and N in a GaInNAs four-element based compound forming the channel layer of the present invention.

As shown in FIG. 6, from study by the inventors, it has been proved that in a region 63 (hereinafter referred to as a region of the present invention) where a Ga concentration is in the range of not less than 0% and not more than 20% and an N concentration is in the range of not less than 3% and not more than 10%, the GaInNAs layer can be grown without causing defects to occur on the InP substrate. In FIG. 6, reference numeral 61 denotes a straight line representing a relationship between the composition of Ga and the composition of N at which GaInNAs lattice matches with respect to InP. When the composition of GaInNAs is represented by $Ga_xIn_{1-x}N_yAs_{1-y}$, the straight line is represented by a formula x=0.47−6.7y. Conventionally, it was considered that x=0.47−3y approximately and that the necessary N concentration was approximately 15%. But, by sorting N ions which does not form clusters by a magnetic field filter according to a mass spectrometry principle to supply the ions uniformly to a substrate surface, and by setting a crystal growth temperature to 550° C. that is the optimal temperature, N atoms disperse uniformly in GaInAs and GaInNAs lattice matches with respect to InP at a lower N atom concentration. As a result, a phenomenon in which the N concentration increases locally and the band gap becomes smaller does not occur, thereby allowing a stable distribution of the lattice matching and the band at a lower N concentration. Especially, when the N concentration is not less than 3% and not more than 7%, a compression strain occurs in the channel layer, and the Hall mobility of approximately 15000 cm$^2$/Vs is stably obtained. This is probably because the Hall mobility is increased, as the effective mass of electrons is greatly decreased when the Ga concentration is not more than 20%. In a first embodiment described below, the channel layer is comprised of $InN_{0.07}As_{0.93}$ (composition ① in FIG. 6) having a composition which lattice matches with respect to the InP substrate. But, with the composition within the region 63 of the present invention, a high Hall mobility of 15000 cm$^2$/Vs or more is obtained. The region 63 of the present invention is set so that a lattice strain is within the range of ±1.5% to obtain a film thickness of the channel layer not less than 10 nm.

The above description is summarized as follows. In GaInNAs which composes the channel layer of the present invention, the Ga concentration is preferably in the range of not less than 0% and not more than 20%, and the N concentration is preferably in the range of not less than 3% and not more than 10%. This is because the effective mass of electrons is greatly decreased and the Hall mobility is increased when the Ga concentration is not more than 20%. Also, an improvement of the operation speed due to an increase in electron velocity is insufficient when the N concentration is less than 3%, and a lattice mismatching with respect to the InP substrate occurs when the N concentration is more than 10%. The range of the N concentration is more preferably not less than 3% and not more than 7%. Because in this range, the compression strain occurs in the channel layer and the high Hall mobility (of approximately 15000 cm$^2$/Vs, in this case) is stably obtained.

Hereinafter, embodiments of the present invention will be described.

[First Embodiment]

Figure 1:
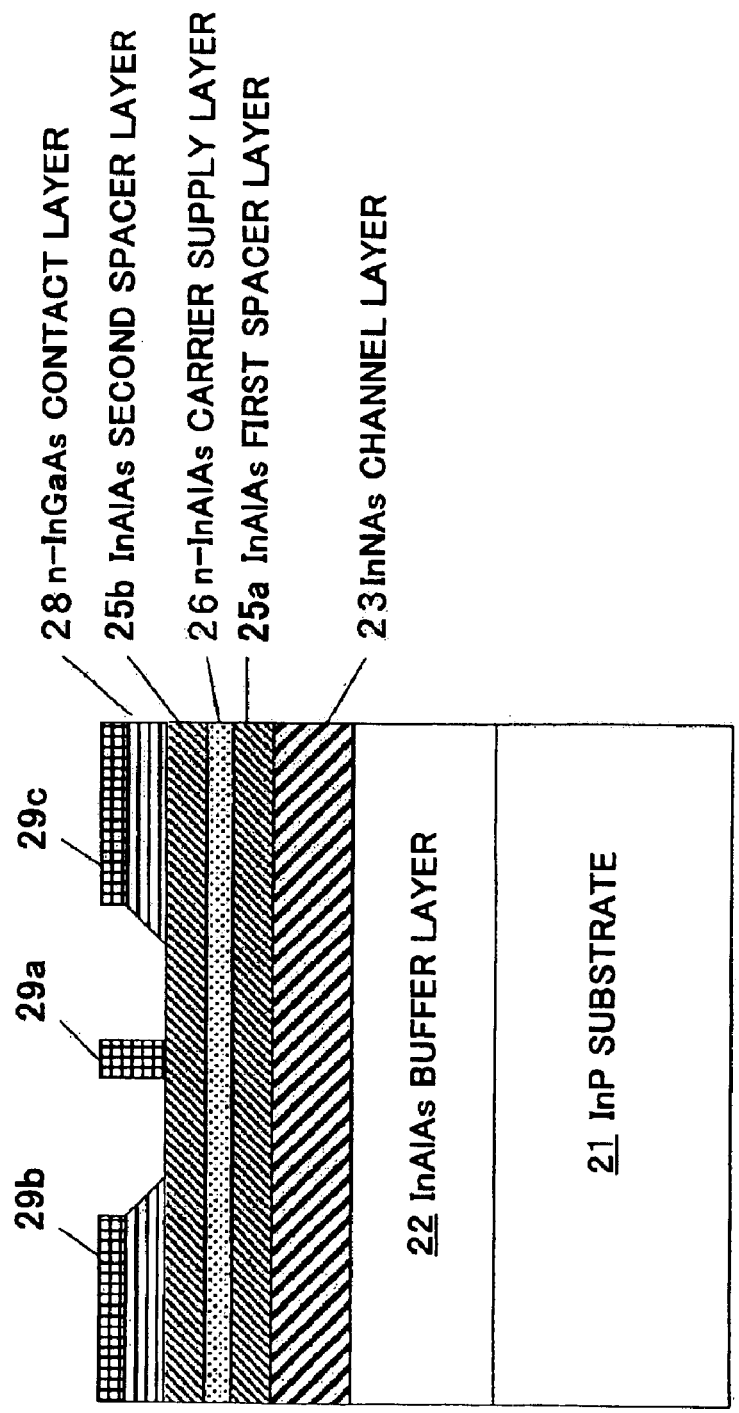
FIG. 1 is a cross-sectional view showing a structure of a hetero field effect transistor according to a first embodiment of the present invention.

FIG. 1 is a cross-sectional view showing a structure of a hetero field effect transistor according to a first embodiment of the present invention.

As shown in FIG. 1, the hetero field effect transistor comprises an InP substrate 21. On the InP substrate 21, an InAlAs buffer layer 22, an InNAs channel layer 23, an InAlAs first spacer layer 25a, an n-InAlAs carrier supply layer 26, and an InAlAs second spacer layer 25b are sequentially formed. On the InAlAs second spacer layer 25b, an electrode 29a constituting a gate electrode is formed, and a pair of electrodes 29b and 29c which constitute a source electrode and a drain electrode, respectively, are formed on both sides of the electrode 29a so as to be spaced apart from each other. The electrodes 29b and 29c are provided on the InAlAs second spacer layer 25b with the n-InGaAs contact layer 28 disposed between the electrodes 29b and 29c and the InAlAs second spacer layer 25b.

Then, a method of fabricating the hetero field effect transistor so structured will be described.

In this method of fabricating the transistor, a gas source MBE (Molecular Beam Epitaxy) process is used. Source gases are PH$_3$, AsH$_3$, N$_2$, In, Ga, and Si. N$_2$ is supplied after being decomposed into N atoms by a plasma source. PH$_3$ and AsH$_3$ are supplied after being thermally decomposed. While supplying PH$_3$, inside a reactor, a temperature is heated up to 550° C. and the i-InAlAs buffer layer (with a film thickness of 500 nm) 22, the InNAs channel layer (20 nm) 23, the i-InAlAs spacer layer (5 nm) 25a, the n$^+$-InAlAs carrier supply layer (10 nm, n-type impurity concentration n=10$^{19}$ cm$^{-3}$) 26, the i-InAlAs spacer layer (20 nm) 25b, and the n$^+$-InGaAs contact layer (100 nm) 28 are grown on the semi-insulating InP substrate 21. Then, a portion of the contact layer 28 corresponding to a gate region is eliminated by etching, and electrode metals 29a, 29b, and 29c composing the gate electrode, the source electrode, and the drain electrode, respectively, are formed on predetermined regions by evaporation. A gate length is set to 0.2 μm and a gate width is set to 200 μm. As a result, while the Hall mobility is 1000 cm$^2$/Vs when the InGaAs layer is formed on the InP substrate, the Hall mobility is in the range from 12000 cm$^2$/Vs to 15000 cm$^2$/Vs in this embodiment of the present invention. Further, while the operation speed f$_T$ of the hetero field effect transistor is 200 GHz when the InGaAs layer is formed on the InP substrate, it increases up to a value in the range of 250 GHz to 300 GHz in this embodiment of the present invention.

[Second Embodiment]

Figure 7:
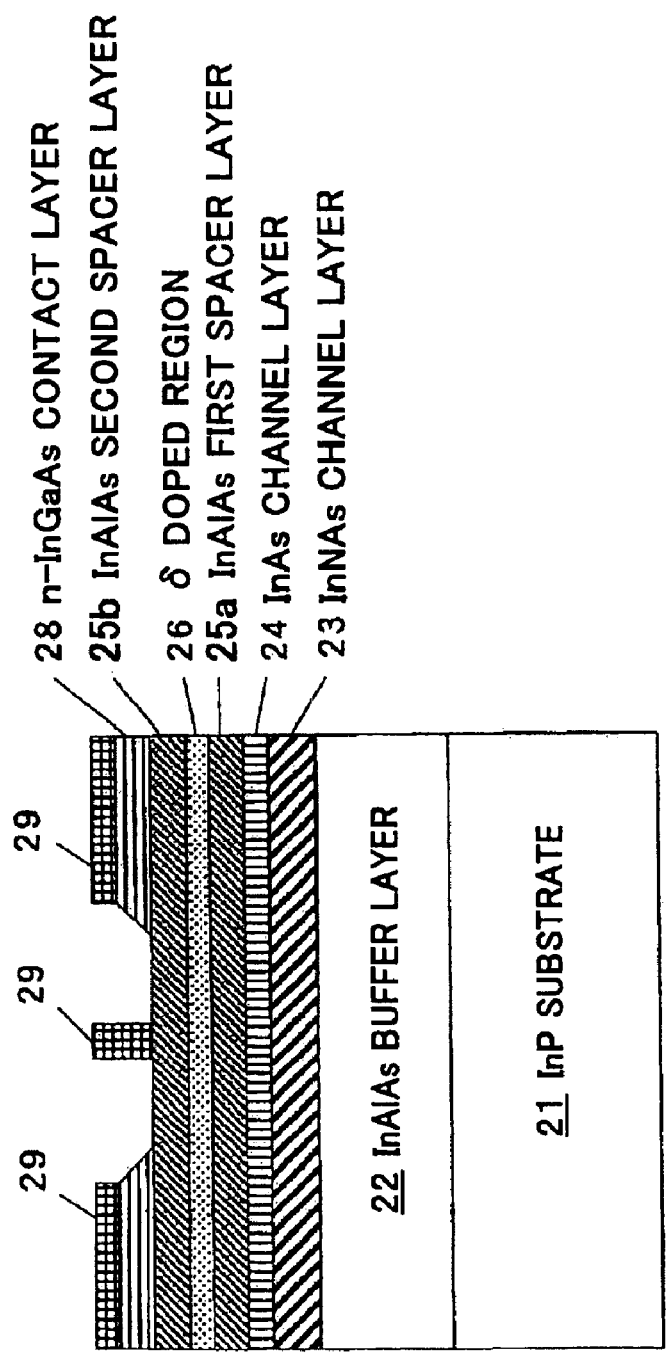
FIG. 7 is a cross-sectional view showing a structure of a hetero field effect transistor according to a second embodiment of the present invention.

FIG. 7 is a cross-sectional view showing a structure of a hetero field effect transistor according to a second embodiment of the present invention. In FIG. 7, reference numerals identical to those in FIG. 1 denote the same or the corresponding parts.

In this embodiment, as shown in FIG. 7, a channel layer comprises two types of layers: an InNAs layer (with a film thickness of 10 nm) 23 as a first channel layer, and an InAs layer (4 nm) 24 formed on the InNAs layer 23 as a second channel layer. Other configuration is identical to that of the first embodiment.

Figure 8:
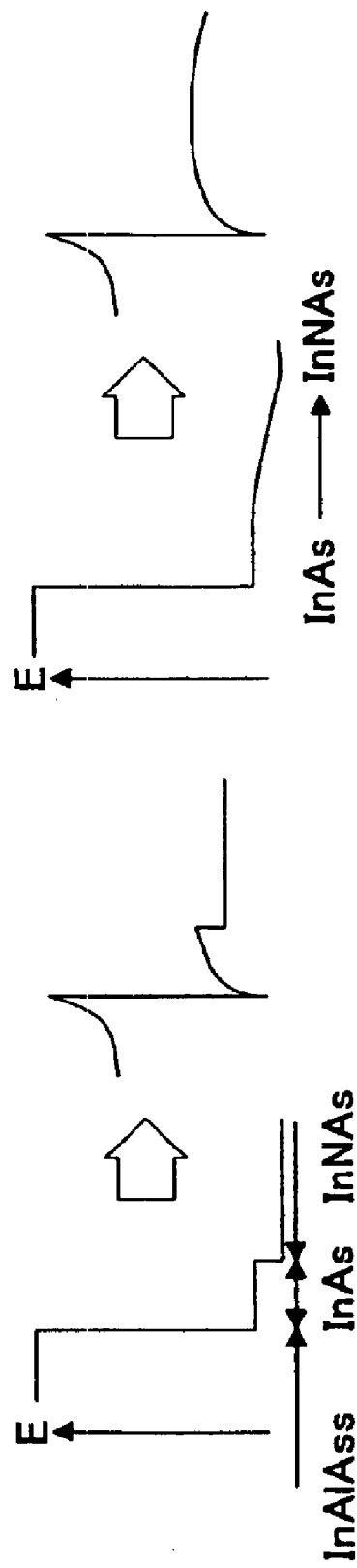
FIGS. 8A and 8B are graphs each showing an energy state in the vicinity of a channel layer of the hetero field effect transistor in FIG. 7.

The reason for thus structuring this hetero field effect transistor is to take advantages of the InAs layer in which a maximum value V$_d$ of an electron velocity of the InAs layer is higher than that of the InNAs layer, as previously described referring to FIGS. 4 and 5. More specifically, as the InAs channel layer 24 lattice mismatches approximately 3% with respect to an InP substrate 21, it is impossible to form the channel layer 24 with a thickness not less than 4 nm. When such a thin InAs layer is formed inside of an InGaAs layer as in the first prior art example, there is a problem that a transition of carriers from the point Γ to the point L occurs before the carriers overflow into the InGaAs layer, thereby causing an operation speed to be lowered. But it has been confirmed that when an $InN_{0.03}As_{0.97}$ channel layer 23 (composition ② in FIG. 6) whose energy is slightly lower than that of the InAs channel layer 24 is provided adjacently to the InAs channel layer 24, the carriers localized in the InAs channel layer 24 overflow from the InAs channel layer 24 to the InNAs channel layer 23 before the carriers transit from the point Γ to the point L, so that an operation speed is not decreased. As the energy of the InNAs channel layer 23 is approximately 0.1 eV lower than that of the InAs channel layer 24, it seems that the carriers travel preferentially through the InNAs channel layer 23. But, in fact, as the InAs channel layer 24 is joined to the InAlAs spacer layer 25 having large band gap, the band curves on an interface between the InAs channel layer 24 and the InAlAs spacer layer 25 as shown in FIG. 8A. So, the electrons are confined in the vicinity of an interface between the InAs channel layer 24 and the InAlAs spacer layer 25.

Furthermore, providing the InAs channel layer 24 between the InAlAs spacer layer 25 and the InNAs channel layer 23 allows Al atom to be supplied after a lapse of time after a supply of N atom has been stopped, during crystal growth. Since the condition in which both Al atom and N atom are supplied at the same time when forming an interface between the InAlAs spacer layer 25 and the InNAs channel layer 23 does not occur, unlike in the first embodiment, the preferable interface is formed. The reason for this is as follows: when Al and N coexist, an insulating material AlN of a high resistance is formed, so that many impurity levels are formed on the interface, but in this embodiment, AlN is not formed because Al and N do not coexist.

In the first and second embodiments, an N concentration in InNAs is set to a fixed value, but in all embodiments, a band structure as shown in FIG. 8B is formed by setting the N concentration to decrease gradually from a substrate side to a surface side (setting the N concentration to decrease as it is closer to the surface in a thickness direction). Especially, in the second embodiment, the carriers are inhibited from overflowing unnecessarily from the InAs channel layer 24 to the InNAs channel layer 23.

In this embodiment, a carrier supply layer is formed by a δ doped region 26 comprising InAlAs and Si added to InAlAs at $5 \times 10^{12}$ cm$^{-2}$ per an atom layer. As a result, it has been found that a Hall mobility is increased up to 20000 cm$^2$/Vs and an operation speed $f_T$ of the hetero field effect transistor is increased up to a value from 400 to 450 GHz.

Figure 9:
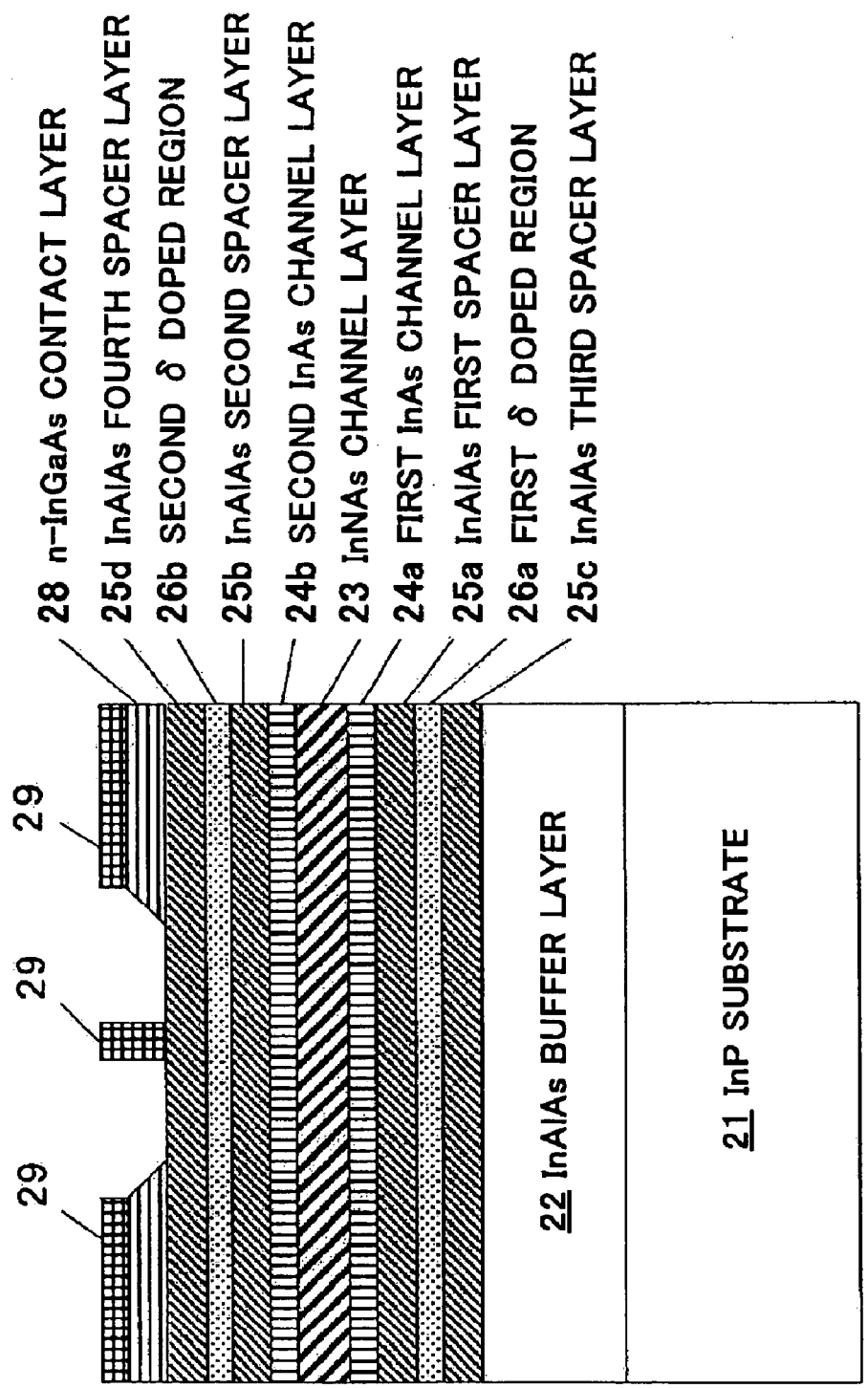
FIG. 9 is a cross-sectional view showing a structure of a hetero field effect transistor according to a first alternative example of the second embodiment of the present invention.

As an alternative example of this embodiment, a double channel structure as shown in FIG. 9 may be adopted. The structure is such that first and second carrier supply layers 26a and 26b each comprising a δ doped region are formed on both sides of a set of channel layers comprising the InNAs channel layer 23, first and second InAs channel layers 24a and 24b, with the first spacer layer 25a comprising InAlAs disposed between the first carrier supply layer 26a and the first channel layer 24a and the second spacer layer 25b comprising InAlAs disposed between the second carrier supply layer 26b and the second channel layer 24b and, the first and second InAs channel layers 24a and 24b are provided on both sides of the InNAs channel layer 23. An InAlAs third spacer layer 25c is formed between the first carrier supply layer 26a and an InAlAs buffer layer 22, and an InAlAs fourth spacer layer 25d is formed on the second carrier supply layer 26b. In this structure, as the amount of current is increased with an increase in the number of channels, a high-speed operation of approximately 500 GHz up to a current range of approximately 500 mA in the case of a single gate has been realized. Also, it has been found that by providing the first and second InAs layers 24a and 24b on both sides of the InNAs layer 23, the carriers which have overflowed from the first and second InAs layers 24a and 24b flow into the InNAs layer 23 and form channels substantially in the InNAs layer 23, and the current flowing through the channels also contributes to an increase in the amount of current.

[Third Embodiment]

Figure 10A:
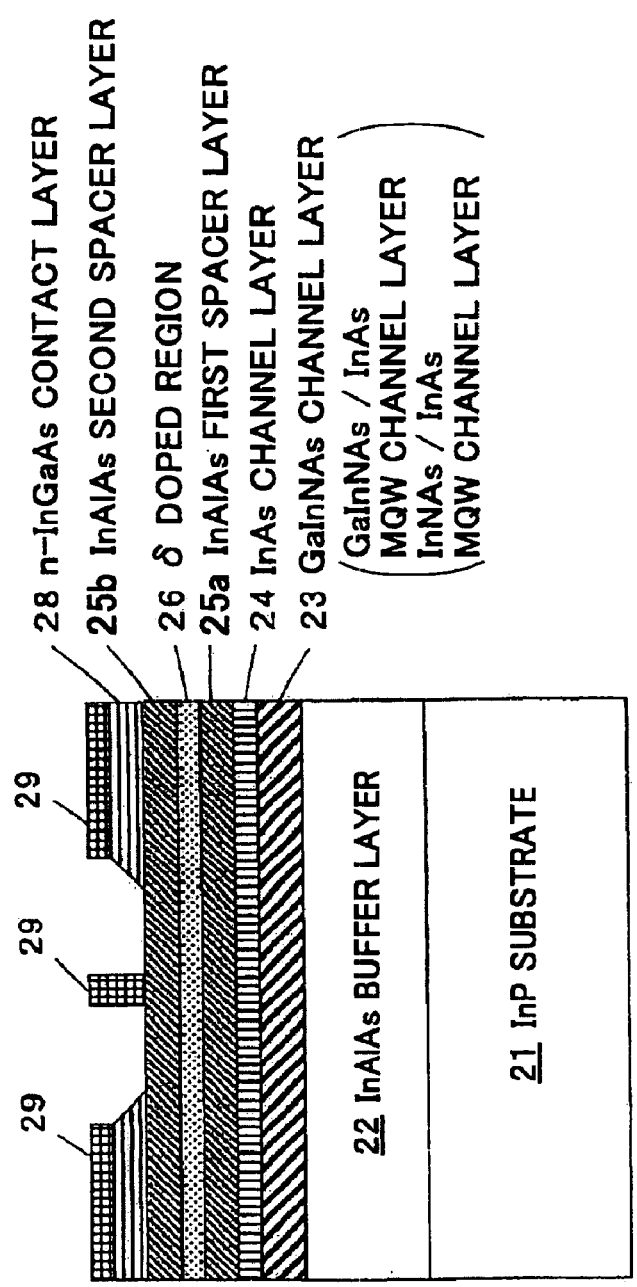
Figure 10B:
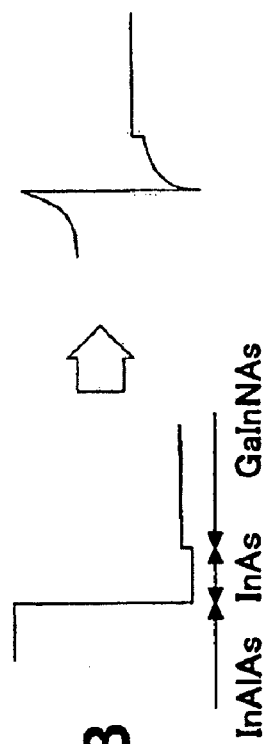

FIG. 10A is a cross-sectional view showing a structure of a hetero field effect transistor according to a third embodiment of the present invention, and FIG. 10B is a view showing an energy state in the vicinity of the channel layer in FIG. 10A. In FIG. 10A, reference numerals identical to those in FIG. 7 denote the same or the corresponding parts.

In this embodiment, as shown in FIG. 10A, a GaInNAs channel layer 23 is formed as a first channel layer, in place of the InNAs channel layer 23 in the second embodiment. Other configuration is identical to that of the second embodiment.

In the second embodiment, since the InNAs layer 23 is used as the first channel layer to facilitate crystal growth, the carriers overflow from the InAs layer 24 as shown in FIG. 8A. Accordingly, in this embodiment, the GaInNAs channel layer 23 obtained by adding Ga to InNAs is used in place of the InNAs channel layer 23 to increase a band gap.

In FIG. 6, an energy counter line 64 represents the same energy gap as that of InAs. In a region of a region 63 of the present invention, where the energy is not lower than that of the energy counter line 64, i. e., in a region where a Ga concentration is three times as high as or higher than an N concentration (x≧3y), the energy of the GaInNAs layer is higher than that of the InAs layer. As a result, as shown in the energy state in FIG. 10B, it has been found that an overflow of carriers from the InAs channel layer 24 (hereinafter, also referred to as InAs layer, simply) to the GaInNAs layer 23 is suppressed. Also, it has been found that by setting the composition of GaInNAs layer 23 to have the Ga concentration of not less than 0.1 (for example, to $Ga_{0.1}In_{0.9}N_{0.03}As_{0.97}$ (composition ③ in FIG. 6)), a high-speed operation of approximately 500 GHz is realized up to a range of a heavy current of approximately 600 mA in the case of a single gate. The GaInNAs layer and the InAs layer are formed with a thickness of 10 nm and 4 nm, respectively.

Next, alternative examples of this embodiment will be described. As a first alternative example, a GaInNAs/InAs MQW channel layer 23 is formed in place of the GaInNAs channel layer 23. The GaInNAs/InAs MQW channel layer 23 is formed by alternately stacking three InAs layers with a thickness of 2 nm and three GaInNAs layers with a thickness of 3 nm. By thus structuring the channel layer 23, a result slightly better than that of the structure previously described has been obtained. Therefore, it becomes possible to stack a plurality of InAs layers, and a range of design condition is enlarged.

In this case, when the composition of GaInNAs is set to $Ga_{0.1}In_{0.9}N_{0.03}As_{0.97}$ (composition ③ in FIG. 6), a compression strain of 1% is introduced into GaInNAs, but when this is set to $Ga_{0.16}In_{0.84}N_{0.05}As_{0.95}$ (composition ④ in FIG. 6), GaInNAs may have the same band gap as that of InAs in a design condition in which GaInNAs lattice matches with respect to InP.

A variation amount of a conduction band is larger in GaInNAs than in InAs. Therefore, to equalize the band gaps of the conduction bands of GaInNAs and InAs, GaInNAs is set to have a composition of $Ga_{0.2}In_{0.8}N_{0.045}As_{0.955}$ (composition ⑤ in FIG. 6). As a result, it has been found that a leakage of the carriers to the GaInNAs layer is suppressed and an operation speed is improved approximately 10%.

Also, in the MQW channel layer 23, an InNAs layer having a composition described below may be formed in place of the GaInNAs layer. That is to say, as the compression strain is introduced into the InAs layer, it becomes possible to stably stack a plurality of InAs channel layers by introducing a tensile strain into the InNAs layer. It has been found that a stacked structure can be stably grown if the InNAs layer has a composition up to $InN_{0.1}As_{0.9}$ (composition ⑥ in FIG. 6) in which the compression strain of 1% is introduced.

As described above, when the stacked structure of the InAs layers and the GaInNAs layers is used, the operation speed is also improved when the Ga concentration is in the range of 0% to 20% and the N concentration is in the range of 3% to 10%.

In the embodiment above-described, that is to say, in the composition of the channel layer shown in FIG. 6, an increase in the band gap is realized by adding Ga to InAsN. Also, by adding P to InAsN to be set to $InAs_{1-y-z}N_yP_z$, the band gap is increased. P has a dependency similar to that of Ga, and it is therefore necessary to set a P concentration to be substantially three times as high as the N concentration (z=3y). An upper limit of the N concentration is not more than 10% also in $InAs_{1-y-z}N_yP_z$, so that ranges of y and z are represented by $0.03<y<0.1$ and $0<z<0.3$, respectively. In this case, it is necessary to completely eliminate P after growth of the first channel layer when crystal is grown, and thus there is a problem that a growth time is increased. But, as a change in the band gap on the conduction band side is larger, it becomes possible to increase an operation current slightly.

Also, in the composition of the GaInNAs channel layer shown in FIG. 6, Sb may be used in place of As. As a mobility of InSb is higher than that of InAs, a high-speed HEMT is realized. For the purpose of obtaining the high-speed HEMT, a GaInNSb channel layer is considered to be more efficient than the GaInNAs layer.

Figure 11:
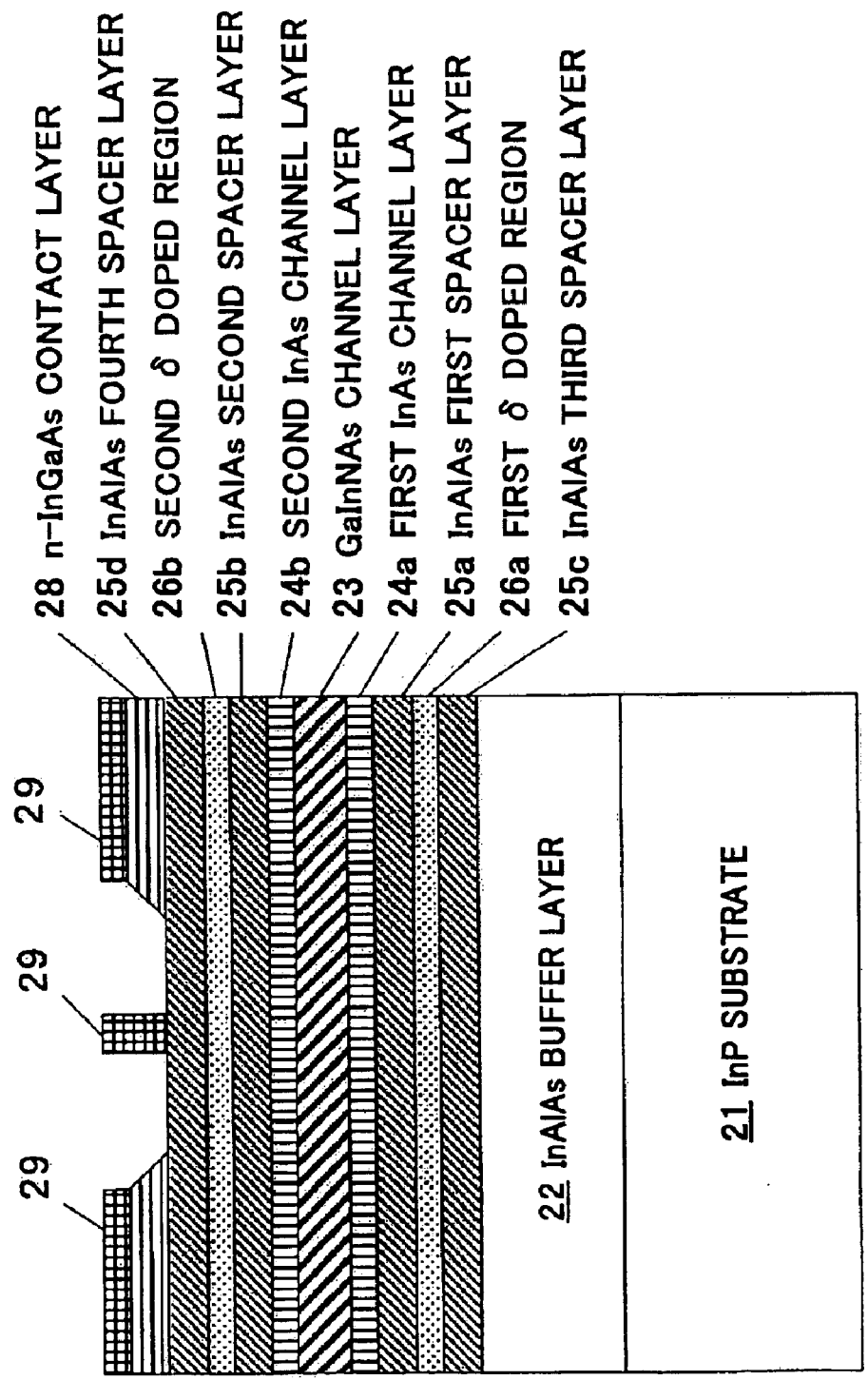
FIG. 11 is a cross-sectional view showing a structure of a hetero field effect transistor according to a second alternative example of the second embodiment of the present invention.

As a second alternative example of this embodiment, a double channel structure as shown in FIG. 11 may be adopted. The structure is such that first and second carrier supply layers 26a and 26b each comprising a δ doped region are formed on both sides of a set of channel layers comprising the GaInNAs channel layer 23, first and second InAs channel layers 24a and 24b, with the first spacer layer 25a comprising InAlAs disposed between the first carrier supply layer 26a and the first channel layer 24a and the second spacer layer 25b comprising InAlAs disposed between the second carrier supply layer 26b and the second channel layer 24b and, the first and second InAs channel layers 24a and 24b are provided on both sides of the GaInNAs channel layer 23 (that is, in the double channel structure shown in FIG. 9, GaInNAs channel layer 23 replaces the InNAs channel layer 23).

In this case, it has been found that the amount of the flowing current varies as the number of the channels is increased.

[Fourth Embodiment]

Figure 12:
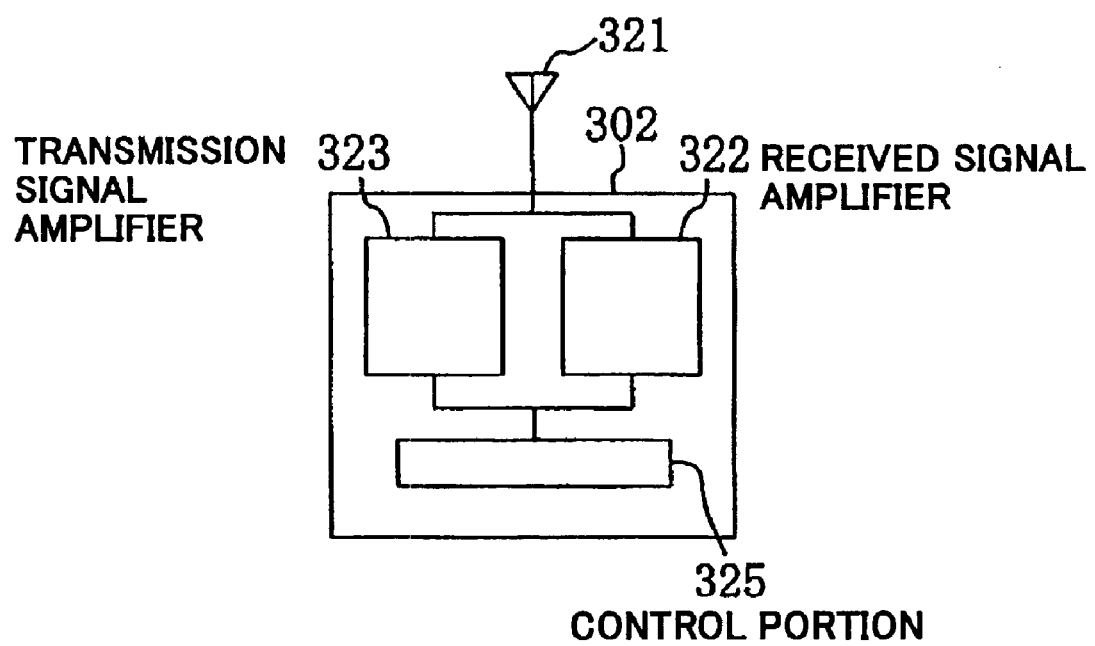
FIG. 12 is a block diagram showing a structure of a transmitter-receiver according to a fourth embodiment of the present invention.
Figure 13:
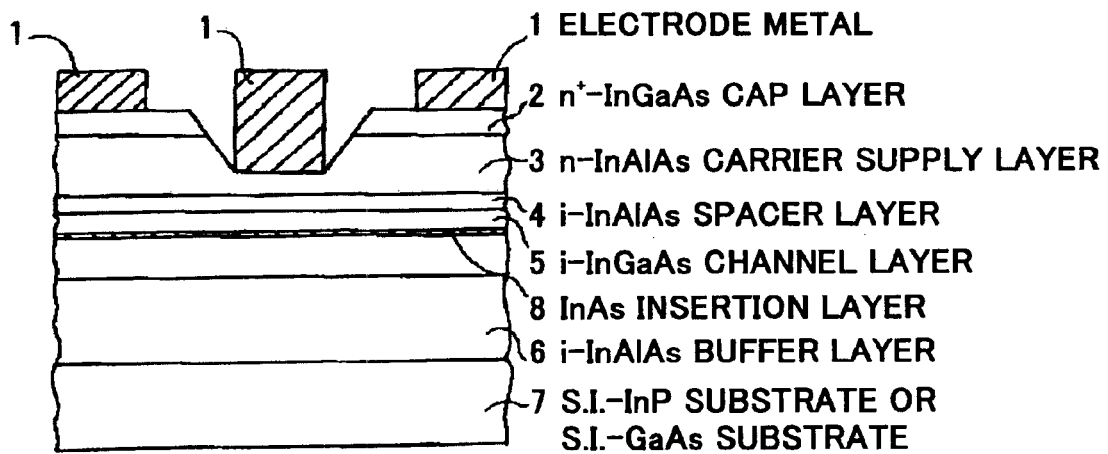
FIG. 13 is a cross-sectional view showing a structure of a hetero field effect transistor according to a first prior art example.
Figure 14:
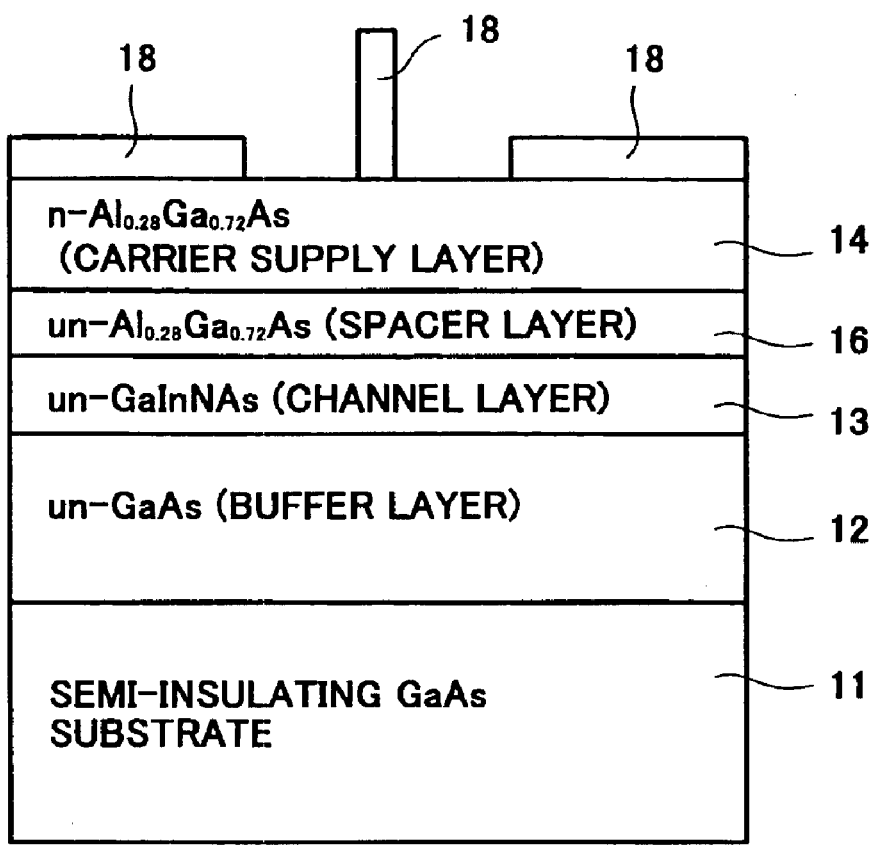
FIG. 14 is a cross-sectional view showing a structure of a hetero field effect transistor according to a second prior art example.

FIG. 12 is a block diagram showing a structure of a transmitter-receiver according to a fourth embodiment of the present invention.

This embodiment exemplifies the transmitter-receiver using the hetero field effect transistor according to one of the first to the third embodiments of the present invention.

As shown in FIG. 12, herein, transmitter-receiver 302 is a wireless terminal. The transmitter-receiver 302 comprises an antenna 321, a received signal amplifier 322 which amplifies a received electric wave signal from the antenna 321, a transmission signal amplifier 323 which amplifies a transmission electric wave signal and transmits the signal to the antenna 321, and a control portion 325 which extracts a received signal from the received electric wave signal from the received signal amplifier 322, generates the transmission electric wave signal by superposing a transmission signal on carrier waves, and transmits the resulting signal to the transmitter signal amplifier 323.

The hetero field effect transistor according to one of the first to the third embodiments of the present invention is used in the amplifiers of the receiver signal amplifier 322 and the transmitter signal amplifier 323 or the like. As described above, the hetero field effect transistor can be operated at a speed higher than that of the prior art examples, so that the transmitter-receiver 302 in this embodiment can be suitably used in a frequency higher than that of the prior art examples (for example, in a terahertz frequency band).

Numerous modifications and alternative embodiments of the invention will be apparent to those skilled in the art in the light of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

What is claimed is:

1. A hetero field effect transistor comprising:

a substrate;

a channel layer provided on the substrate with a buffer layer disposed between the substrate and the channel layer;

a spacer layer constituted by a semiconductor having a band gap larger than a band gap of the channel layer, the spacer layer being formed to hetero-join to the channel layer; and a carrier supply layer formed to be adjacent to the spacer layer, wherein the substrate is made of InP, the channel layer comprises a compound semiconductor layer represented by a formula $Ga_xIn_{1-x}N_yA_{1-y}$ in which A is As or Sb, composition x satisfies $0 \leq x \leq 0.2$, and composition y satisfies $0.03 \leq y \leq 0.10$.

2. The hetero field effect transistor according to claim 1, wherein the composition y satisfies $0.03 \leq y \leq 0.07$.

3. The hetero field effect transistor according to claim 1, wherein

A is As.

4. The hetero field effect transistor according to claim 1, wherein

A is Sb.

5. The hetero field effect transistor according to claim 1, wherein the channel layer is constituted by only the compound semiconductor layer.

6. The hetero field effect transistor according to claim 3, wherein the channel layer comprises a first channel layer and a second channel layer which is formed to be adjacent to the first channel layer and hetero-joins to the spacer layer, the first channel layer is constituted by the compound semiconductor layer, and the second channel layer is constituted by an InAs layer.

7. The hetero field effect transistor according to claim 6, wherein x is 0.

8. The hetero field effect transistor according to claim 6, wherein an N concentration in the first channel layer decreases as the N concentration is closer to the second channel layer.

9. The hetero field effect transistor according to claim 6, wherein a pair of second channel layers are formed to be adjacent to upper and lower surfaces of the first channel layer, a pair of spacer layers are formed to hetero-join to the pair of second channel layers, respectively, and a pair of carrier supply layers are formed to be adjacent to the pair of spacer layers, respectively.

10. The hetero field effect transistor according to claim 6, wherein 0<x is satisfied.

11. The hetero field effect transistor according to claim 10, wherein $3y \leq x \leq 0.2$ is satisfied.

12. The hetero field effect transistor according to claim 10, wherein $0.1 \leq x \leq 0.2$ is satisfied.

13. The hetero field effect transistor according to claim 6, wherein the first channel layer is constituted by a GaInNAs/InAs MQW layer having a multiple quantum well structure formed by alternately stacking a GaInNAs layer constituted by the compound semiconductor layer in which 0<x is satisfied and an InAs layer.

14. The hetero field effect transistor according to claim 6, wherein the first channel layer is constituted by an InNAs/InAs MQW layer having a multiple quantum well structure formed by alternately stacking an InNAs layer constituted by the compound semiconductor layer in which x is 0 and an InAs layer.

15. The hetero field effect transistor according to claim 1, wherein the buffer layer and the spacer layer are each constituted by an InAlAs layer, and the carrier supply layer is constituted by an n-InAlAs layer.

16. A method of fabricating a hetero field effect transistor, comprising the steps of:

forming a channel layer on a substrate with a buffer layer disposed between the substrate and the channel layer;

forming a spacer layer constituted by a semiconductor having a band gap larger than a band gap of the channel layer to hetero-join to the channel layer; and forming a carrier supply layer to be adjacent to the spacer layer, wherein the substrate is made of InP, the channel layer comprises a compound semiconductor layer represented by a formula $Ga_xIn_{1-x}N_yA_{1-y}$ in which A is As or Sb, composition x satisfies $0 \leq x \leq 0.2$, and composition y satisfies $0.03 \leq y \leq 0.10$.

17. The method of fabricating a hetero field effect transistor according to claim 16, wherein ionized N atom is introduced in the step of forming the channel layer.

18. The method of fabricating a hetero field effect transistor according to claim 16, further comprising the step of:

forming the buffer layer made of InAlAs on the InP substrate, wherein the step of forming the channel layer comprises the steps of forming a first channel layer made of InNAs on the buffer layer and forming a second channel layer made of InAs on the first channel layer, and the step of forming the spacer layer comprises the step of forming the spacer layer made of InAlAs on the second channel layer.

19. A transmitter-receiver comprising the hetero field effect transistor according to claim 1 for processing a transmission signal or a received signal.

* * * * *